United States Patent [19]

Ogino

[11] Patent Number: 5,132,770
[45] Date of Patent: Jul. 21, 1992

[54] SEMICONDUCTOR DEVICE HAVING IMPROVED MULTI-LAYERED SUBSTRATE STRUCTURE

[75] Inventor: Masanobu Ogino, Yokosuka, Japan

[73] Assignee: Kabushiki Kaisha Toshiba, Kawasaki, Japan

[21] Appl. No.: 639,734

[22] Filed: Jan. 10, 1991

Related U.S. Application Data

[63] Continuation of Ser. No. 392,898, Aug. 14, 1989, abandoned.

[30] Foreign Application Priority Data

Aug. 25, 1988 [JP] Japan .................................. 63-211383

[51] Int. Cl.⁵ .......................................... H01L 29/04
[52] U.S. Cl. ....................................... 357/59; 357/49; 357/50; 357/52
[58] Field of Search ........................ 357/59, 49, 50, 52

[56] References Cited

U.S. PATENT DOCUMENTS

| | | | |
|---|---|---|---|
| 4,484,207 | 11/1984 | Nishizawa et al. | 357/59 |
| 4,875,086 | 10/1989 | Malhi et al. | 357/59 |
| 4,881,116 | 11/1989 | Lesk et al. | 357/59 |

Primary Examiner—Edward J. Wojciechowicz
Attorney, Agent, or Firm—Finnegan, Henderson, Farabow, Garrett, and Dunner

[57] ABSTRACT

A semiconductor device includes a composite semiconductor substrate formed by disposing first and second semiconductor substrates in close contact with each other. At least one dielectric layer is formed in the composite semiconductor substrate. At least one polycrystalline layer is formed adjacent to the dielectric layer.

18 Claims, 3 Drawing Sheets

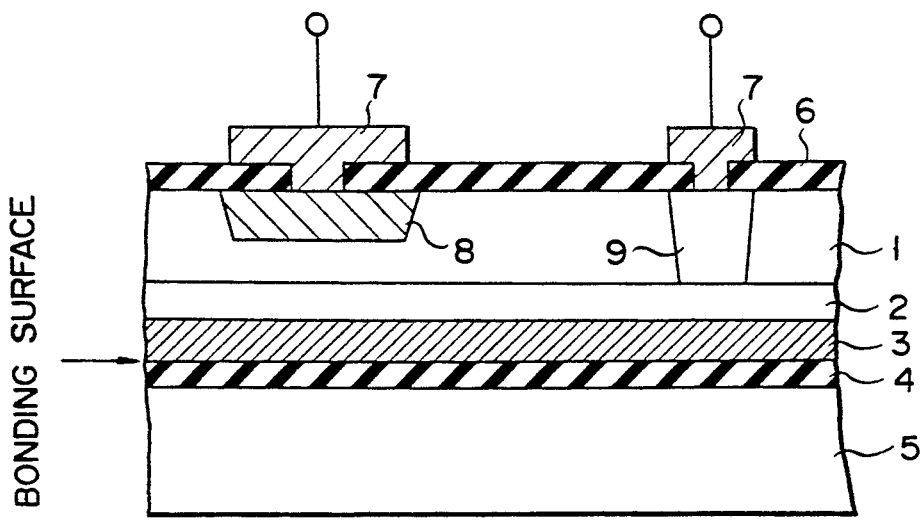
F I G. 1
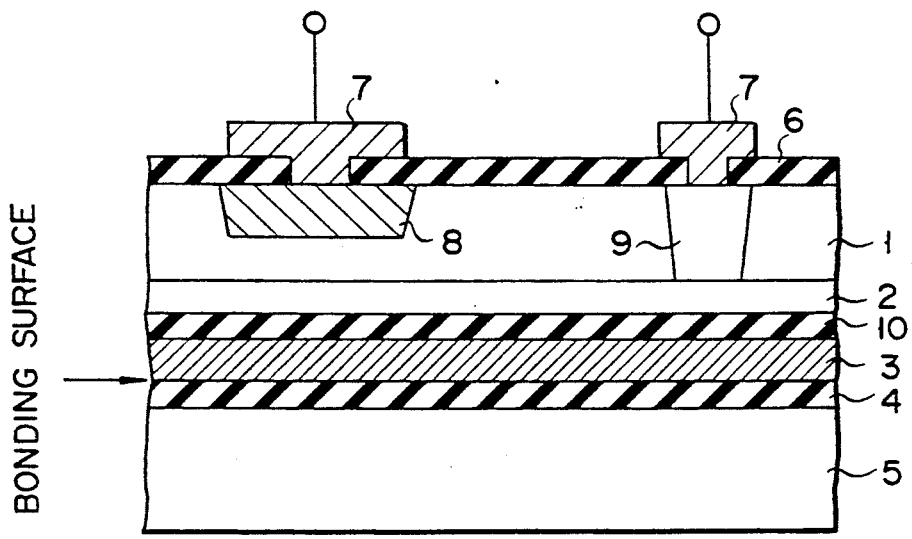
F I G. 2
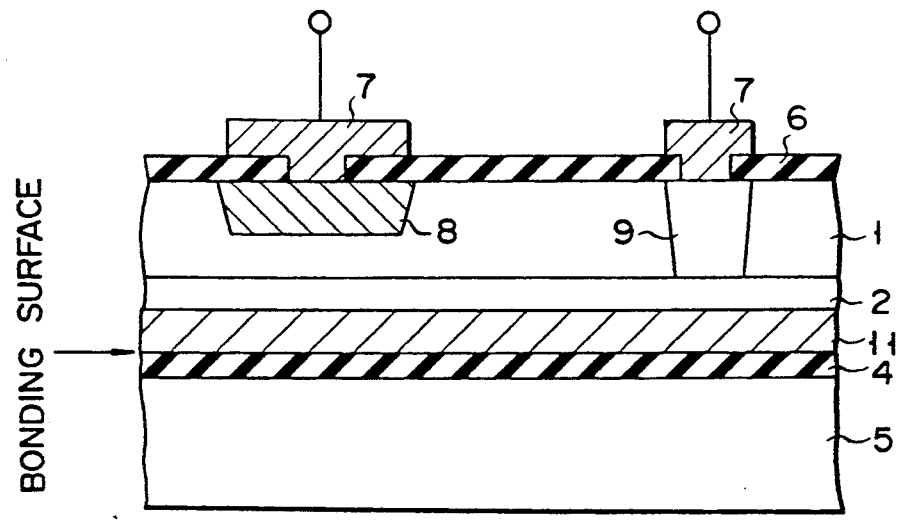
F I G. 3

SEMICONDUCTOR DEVICE HAVING IMPROVED MULTI-LAYERED SUBSTRATE STRUCTURE

This application is a continuation, of application Ser. No. 392,898, filed Aug. 14, 1989 now abandoned.

BACKGROUND OF THE INVENTION

1. Field of the Invention

The present invention relates to a semiconductor device and, more particularly, to a semiconductor device having a structure wherein a plurality of semiconductor substrates are stacked.

2. Description of the Related Art

In recent years, a technique for directly bonding a plurality of different semiconductor substrates, in particular silicon semiconductor substrates, to each other in order to manufacture a multi-layered semiconductor substrate has been employed. A method of manufacturing a semiconductor device such as a diode on a dielectric film by using this technique generally comprises the following steps. More specifically, first and second silicon semiconductor substrates are prepared, then, one surface of the first semiconductor substrate is mirror-polished. As (arsenic) is ion-implanted in the mirror-polished surface and diffused to a predetermined depth, a heavily doped $n^+$-type diffusion layer is formed. Then, one surface of the second silicon semiconductor substrate is mirror-polished for growing a thermal oxide film thereon. Thereafter, these mirror-polished surfaces are bonded to each other in air at room temperature and annealed in an oxygen atmosphere at 1,100° C. In addition, the first silicon semiconductor substrate side surface is polished to a predetermined thickness. Thereafter, predetermined operations are executed to form a heavily doped $n^+$-type diffusion layer for cathode electrode extraction and a heavily doped $p^+$-type diffusion layer for anode electrode extraction. Thereafter, anode and cathode electrodes are formed by patterning, thus manufacturing a diode.

On the other hand, during manufacture of the semiconductor device, contamination atoms are often contained in a substrate of the device. Therefore, a leak current at a p-n junction of the semiconductor device increases, and the lifetime of minority carriers is shortened, thus degrading the performance of the semiconductor device. In the semiconductor device using a multi-layered substrate, no consideration has been made to solve the above problems. Therefore, a high-performance and high-reliability semiconductor device cannot be manufactured.

SUMMARY OF THE INVENTION

It is, therefore, an object of the present invention to provide a high-performance and high-reliability semiconductor device by minimizing contamination during manufacture.

A semiconductor device comprises:
a first semiconductor substrate;
a second semiconductor substrate disposed in close contact with said first semiconductor substrate to form a composite semiconductor substrate;
at least one dielectric layer formed in said composite semiconductor substrate; and
at least one polycrystalline layer formed ad to said dielectric layer(s).

BRIEF DESCRIPTION OF THE DRAWINGS

The foregoing aspects and other features of the invention will be explained in the following description in connection with the accompanying drawings wherein:

FIG. 1 is a sectional view of a diode formed using a semiconductor device according to a first embodiment of the present invention;

FIG. 2 is a sectional view of a diode formed using a semiconductor device according to a second embodiment of the present invention;

FIG. 3 is a sectional view of a diode formed using a semiconductor device according to a third embodiment of the present invention;

DETAILED DESCRIPTION OF THE PREFERRED EMBODIMENTS

Figure 4:
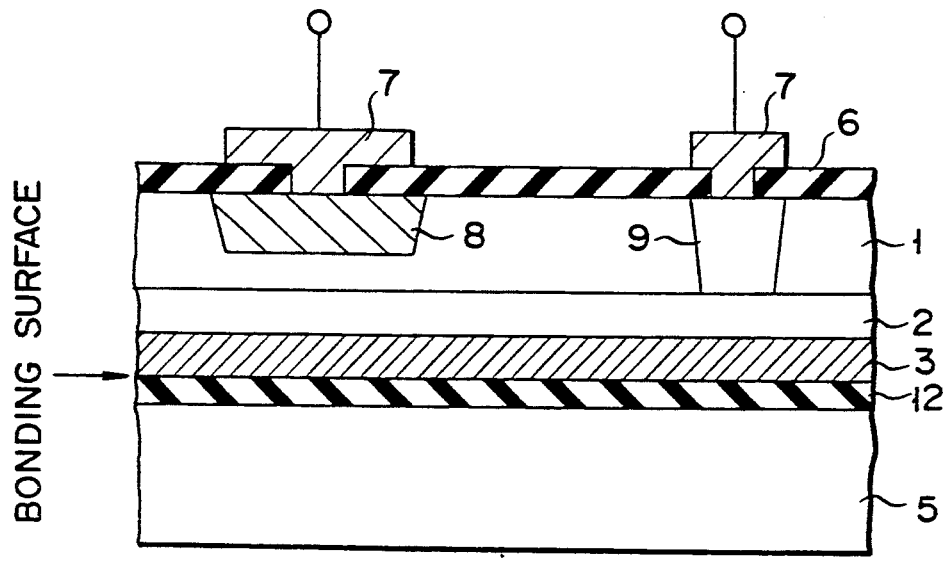
FIG. 4 is a sectional view of a diode formed using a semiconductor device according to a fourth embodiment of the present invention.

A multi-layered semiconductor substrate according to the first to fifth embodiments of the present invention will be described hereinafter with reference to the accompanying drawings.

FIG. 1 is a sectional view of a diode formed using a multi-layered semiconductor substrate according to a first embodiment of the present invention.

A method of manufacturing such a diode will be described below.

First and second silicon semiconductor substrates 1 and 5 are prepared. Then, one surface of the first silicon semiconductor substrate 1 is mirror-polished. Thereafter, e.g., As (arsenic) is ion-implanted in the substrate and thermally diffused to a predetermined depth, thus forming a heavily doped $n^+$-type diffusion layer 2. Then, a polysilicon layer 3 having a thickness of, e.g., about 2,000 Å is grown on the diffusion layer 2 by LPCVD (low pressure chemical vapor deposition) at a growth temperature of, e.g., about 650° C.

After one surface of the second silicon semiconductor substrate 5 is mirror-polished, a thermal oxide film 4 is then grown. The first silicon semiconductor substrate 1 is set upside down so that these mirror-polished surfaces of the first and second silicon semiconductor substrates are bonded to each other in air at room temperature. Thereafter, annealing is performed in an oxygen atmosphere at 1,100° C. to bond crystallographically the first and second silicon semiconductor substrates 1 and 5 to each other. Then, the silicon semiconductor substrate 1 side surface is polished to a predetermined thickness.

Sequentially, in the first and second semiconductor substrates bonded in the above steps, a thermal oxide film 6 is formed on the first silicon semiconductor substrate 1, serving as an upper layer, by thermal oxidation.

Thereafter, the oxide film on a cathode electrode extraction region is removed using a photoresist, and e.g., P (phosphorus) is ion-implanted in the region. In addition, the P atoms are thermally diffused and a heavily doped n+-type diffusion layer 9 for cathode electrode extraction is formed in contact with the heavily doped n+-type diffusion layer 2. Then the photoresist is removed and the oxide film on an anode electrode extraction region is removed by another photoresist. In addition, e.g., B (boron) is ion-implanted and thermally diffused. Therefore, a heavily doped p+-type diffusion layer 8 for anode electrode extraction is formed. Then, after the photoresist is removed, a polysilicon layer containing P (phosphorus) is deposited on the entire surface and patterning is performed to form anode and cathode electrodes 7. By means of the above steps, a diode formed by using the multi-layered semiconductor substrate according to the first embodiment of the present invention is manufactured.

During manufacture of the semiconductor device, contamination atoms such as Fe and Cu are introduced due to contamination. Such contaminant atoms are precipitated in a semiconductor crystal to cause crystal defects. In addition, the contaminant atoms themselves form a carrier trap, causing an increase in leak current in a p-n junction and reduction in the lifetime of minority carriers.

In order to solve the above problems, in general, a gettering technique is employed. In this embodiment, the polysilicon layer 3, adjacent to the thermal oxide film 4 as a dielectric layer inserted between the first and second silicon semiconductor substrates 1 and 5, is provided to allow gettering. In other words, this polysilicon layer 3 serves as a core to perform gettering of the contamination atoms, and the contamination atoms are trapped in crystal defects and the like in the polysilicon layer 3. Therefore, the number of contaminant atoms in the first and second silicon semiconductor substrates 1 and 5 is significantly decreased, so that a high-performance and high-reliability diode can be provided.

A diode formed using a multi-layered semiconductor substrate according to a second embodiment of the present invention will be described hereinafter with reference to a sectional view of FIG. 2.

First and second silicon semiconductor substrates 1 and 5 are prepared. Then, one surface of the first silicon semiconductor substrate 1 is mirror-polished. Thereafter, e.g., As (arsenic) is ion-implanted in the substrate, and a thermal oxide film 10 is formed by thermal oxidation. The implanted As (arsenic) ions are diffused to a predetermined depth by heat at this time, and a heavily doped n+-type diffusion layer 2 is formed. Then, a polysilicon layer 3 having a thickness of, e.g., about 2,000 Å is grown on the diffusion layer 2 at a growth temperature of, e.g., about 650° C. by LPCVD.

Then, one surface of the second silicon semiconductor substrate 5 is mirror-polished, and a thermal oxide film 4 is grown thereon. The first silicon semiconductor substrate 1 is set upside down so that these mirror-polished surfaces of the first and second silicon semiconductor substrates are bonded to each other in air at room temperature. Thereafter, annealing is performed in an oxygen atmosphere at 1,100° C. to bond crystallographically the first and second silicon semiconductor substrates 1 and 5 to each other. Then, the silicon semiconductor substrate 1 side surface is polished to a predetermined thickness.

Sequentially, in the bonded first and second semiconductor substrates, a thermal oxide film 6 is formed on the first silicon semiconductor substrate 1 serving as an upper layer by thermal oxidation. Thereafter, the oxide film on a cathode electrode extraction region is removed using a photoresist, and e.g., P (phosphorus) is ion-implanted and thermally diffused, thus forming a heavily doped n+-type diffusion layer 9 for cathode electrode extraction to be in contact with the heavily doped n+-type diffusion layer 2. Then, the photoresist is removed and the oxide film on an anode electrode extraction region is removed by another photoresist. B (boron), for example, is then ion-implanted and thermally diffused to form a heavily doped p+-type diffusion layer 8 for anode electrode extraction. Then, after the photoresist is removed, a polysilicon layer containing P (phosphorus) is deposited on the entire surface, and patterning is performed to form anode and cathode electrodes 7. By means of the above steps, a diode formed using the multi-layered semiconductor substrate according to the second embodiment of the present invention is manufactured.

In this embodiment, the polysilicon layer 3, adjacent to the thermal oxide film 4 as a dielectric layer inserted between the first and second silicon semiconductor substrates 1 and 5, is provided to allow gettering. In other words, this polysilicon layer 3 serves as a core to perform gettering of the contaminant atoms, and the contaminant atoms are trapped in crystal defects and the like in the polysilicon layer 3. Therefore, the number of contaminant atoms in the first and second silicon semiconductor substrates 1 and 5 is significantly decreased, so that a high-performance and high-reliability diode can be provided. In particular, in this embodiment, two dielectric layers consisting of the thermal oxide films 4 and 10 are inserted between the first and second different silicon semiconductor substrates 1 and 5, so that the insulation capability between the upper and lower silicon semiconductors substrates 1 and 5 can be improved.

A diode formed using a multi-layered semiconductor substrate according to a third embodiment of the present invention will be described hereinafter with reference to a sectional view of FIG. 3.

First and second silicon semiconductor substrates 1 and 5 are prepared. Then, one surface of the first silicon semiconductor substrate 1 is mirror-polished. Thereafter, e.g., As (arsenic) is ion-implanted in the substrate and thermally diffused to a predetermined depth, thus forming a heavily doped n+-type diffusion layer 2. Then, a polysilicon layer 11 containing P (phosphorus) at a concentration of about $5 \times 10^{19}$ atoms/cm$^3$ is grown on the diffusion layer 2.

Then, one surface of the second silicon semiconductor substrate 5 is mirror-polished, and a thermal oxide film 4 is grown. The first silicon semiconductor substrate 1 is set upside down so that these mirrorpolished surfaces of the first and second silicon semiconductor substrates are bonded to each other in air at room temperature. Thereafter, annealing is performed in an oxygen atmosphere at 1,100° C. to bond crystallographically the first and second silicon semiconductor substrates 1 and 5 to each other. Then, the silicon semiconductor substrate 1 side surface is polished to a predetermined thickness.

Subsequently, in the bonded first and second semiconductor substrates 1 and 5, a thermal oxide film 6 is formed on the first silicon semiconductor substrate 1 serving as an upper layer by thermal oxidation. Thereafter, the oxide film on a cathode electrode extraction region is removed using a photoresist, and e.g., P (phosphorus) is ion-implanted in the region. In addition, thermal diffusion is performed to form a heavily doped n+-type diffusion layer 9 for cathode electrode extraction to be in contact with the heavily doped n+-type diffusion layer 2. Then, the photoresist is removed and the oxide film on an anode electrode extraction region is removed by another photoresist. In addition, e.g., B (boron) is ion-implanted and thermally diffused, and a heavily doped p+-type diffusion layer 8 for anode electrode extraction is formed. Then, after the photoresist is removed, a polysilicon layer containing P (phosphorus) is deposited on the entire surface and patterning is performed to form anode and cathode electrodes 7. By means of the above steps, the diode formed by using the multi-layered semiconductor substrate according to the third embodiment of the present invention is manufactured.

In this embodiment, the polysilicon layer 11, adjacent to the thermal oxide film 4 as a dielectric layer inserted between the first and second silicon semiconductor substrates 1 and 5, is provided to allow gettering. In other words, this polysilicon layer 11 serves as a core to perform gettering of the contaminant atoms, and the contaminant atoms are trapped in crystal defects and the like in the polysilicon layer 11. Therefore, the number of contamination atoms in the first and second silicon semiconductor substrates 1 and 5 is greatly decreased, so that a high-performance and high-reliability diode can be provided.

Figure 6:
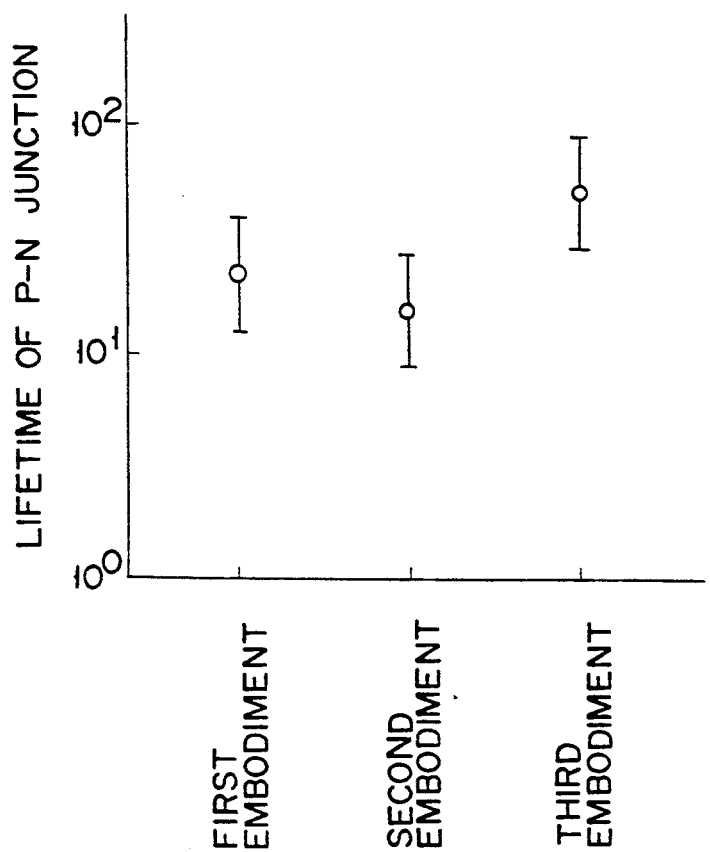
FIG. 6 is a graph showing ratios of the lifetimes of the first to third embodiments to that of a conventional semiconductor device when the life time of a p-n junction of the conventional semiconductor device is "1"

In addition, since the polysilicon layer 11 contains P (phosphorus) at a concentration of about $5 \times 10^{19}$ atoms/cm$^3$, as shown in FIG. 6, the gettering capability of the polysilicon layer 11 is further enhanced.

A diode formed using a multi-layered semiconductor substrate according to a fourth embodiment of the present invention will be described hereinafter with reference to a sectional view of FIG. 4.

First and second silicon semiconductor substrates 1 and 5 are prepared. Then, one surface of the first silicon semiconductor substrate 1 is mirror-polished. Thereafter, e.g., As (arsenic) is ion-implanted in the substrate and thermally diffused to a predetermined depth, thus forming a heavily doped n+-type diffusion layer 2. Then, a polysilicon layer 3 having a thickness of, e.g., about 2,000 Å is grown on the diffusion layer 2 at a growth temperature of, e.g., about 650° C. by LPCVD. A BPSG (boro-phosphosilicate glass) film 12 is grown on the mirror-polished surface of the second silicon semiconductor substrate 5, and the first silicon semiconductor substrate 1 is set upside down so that these mirror-polished surfaces of the first and second silicon semiconductor substrates are bonded to each other in air at room temperature. Thereafter, annealing is performed in an oxygen atmosphere at 1,100° C. to bond crystallographically the first and second silicon semiconductor substrates 1 and 5 to each other. At this time, an uneven surface of the polysilicon layer 3 is buried with a viscous flow of the BPSG (boro-phosphosilicate glass), and the bonding strength of the surfaces is further increased. Then, the silicon semiconductor substrate 1 side surface is polished to a predetermined thickness.

Subsequently, in the bonded first and second semiconductor substrates 1 and 5, a thermal oxide film 6 is formed on the first silicon semiconductor substrate 1, serving as an upper layer, by thermal oxidation. Thereafter, the oxide film on a cathode electrode extraction region is removed using a photoresist, and e.g., P (phosphorus) is ion-implanted and thermally diffused, thus forming a heavily doped n+-type diffusion layer 9 for cathode electrode extraction to be in contact with the heavily doped n+-type diffusion layer 2. Then, the photoresist is removed and the oxide film on an anode electrode extraction region is removed by another photoresist. For example, B (boron) is ion-implanted and thermally diffused to form a heavily doped p+-type diffusion layer 8 for anode electrode extraction. Then, after the photoresist is removed, a polysilicon layer containing P (phosphorus) is deposited on the entire surface, and patterning is performed to form anode and cathode electrodes 7. By means of the above steps, the diode formed by using the multi-layered semiconductor substrate according to the fourth embodiment of the present invention is manufactured.

In this embodiment, the polysilicon layer 3, adjacent to the BPSG film 12 as a dielectric layer and inserted between the first and second silicon semiconductor substrates 1 and 5, is formed to allow gettering. In other words, this polysilicon layer 3 serves as a core to perform gettering of the contaminant atoms, and the contaminant atoms are trapped in crystal defects and the like of the polysilicon layer 3. Therefore, the number of contaminant atoms in the first and second silicon semiconductor substrates 1 and 5 is greatly decreased, so that a high-performance and high-reliability diode can be provided.

In addition, by using the BPSG (boro-phosphosilicate glass) film 12 as a dielectric inserted between the silicon semiconductor substrates, this BPSG (boro-phosphosilicate glass) film 12 has a viscosity obtained by heat in the bonding step. Since the uneven surface of the opposite polysilicon layer 3 is buried with the viscous flow, a higher bonding strength between the different silicon semiconductor substrates can be obtained. When BSG (borosilicate lass) or PSG (phosphosilicate glass) is used as a material of this dielectric layer, the same effect as in the above embodiments can be obtained.

A modification of a silicon semiconductor substrate according to the third embodiment will be described hereinafter as a fifth embodiment with reference to FIG. 5.

Figure 5:
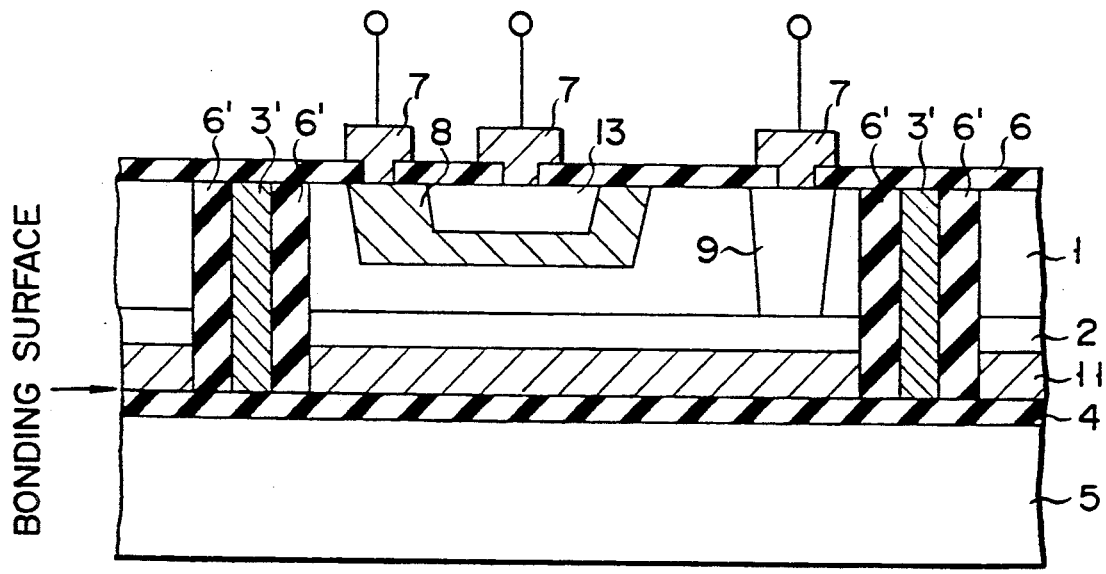
FIG. 5 is a sectional view showing a modification of the semiconductor device according to the third embodiment.

FIG. 5 shows an insulating layer isolation type bipolar integrated circuit. A method of manufacturing this circuit will be described below.

First and second silicon semiconductor substrates 1 and 5 are prepared.

After one surface of the first silicon semiconductor substrate 1 is mirror-polished, e.g., As (arsenic) is ion-implanted in the substrate and thermally diffused to a predetermined depth, thus forming a heavily doped n+-type diffusion layer 2. Then, a polysilicon layer 11 containing P (phosphorus) is grown on the diffusion layer 2.

Then, a thermal oxide film 4 is grown on the mirror-polished surface of the second silicon semiconductor substrate 5. The first silicon semiconductor substrate 1 is set upside down so that the mirror-polished surfaces of the first and second silicon semiconductor substrates are bonded to each other in air at room temperature. Thereafter, annealing is performed in an oxygen atmosphere at 1,100° C. to bond crystallographically the first and second silicon semiconductor substrates 1 and 5 to each other. Then, the silicon semiconductor substrate 1 side surface is polished to a predetermined thickness.

Subsequently, in the bonded first and second semiconductor substrates 1 and 5, a photoresist is deposited on the first silicon semiconductor substrate 1, serving as an upper layer to form an insulating region formation pattern for element isolation. Thereafter, a hole for the element isolation insulating region is formed to reach the thermal oxide film 4 on the lower silicon semiconductor substrate. Then, the side surface of the hole is oxidized to form an oxide film 6', and a polysilicon layer 3' is deposited in the hole. Subsequently, the photoresist is removed and another photoresist is deposited to form a base region pattern. B (boron), for example, is ion-implanted in a base formation region, then the photoresist is removed, and still another photoresist is deposited to form a collector electrode extraction region 9 and an emitter formation pattern. In addition, e.g., P (phosphorus) is ion-implanted in the collector electrode extraction region 9 and the emitter formation region. Then, a thermal oxide film 6 is deposited on the entire surface by thermal oxidation. At this time, the implanted atoms are diffused to a predetermined depth due to heat by thermal oxidation to form a base diffusion layer 8, an emitter diffusion layer 13, and the collector electrode extraction region 9. Then, a contact hole is formed in these diffusion layers, and a polysilicon layer containing P (phosphorus) is deposited on the entire surface. In addition, patterning is performed to form base, emitter, and collector electrodes 7. Thus, the insulating layer isolation type bipolar integrated circuit of the fifth embodiment formed by using the multi-layered semiconductor substrate of the present invention is manufactured. In this embodiment, the polysilicon layer 11, adjacent to the thermal oxide film 4 as a dielectric layer inserted between the first and second silicon semiconductor substrates 1 and 5, is provided to allow gettering. In other words, this polysilicon layer 11 serves as a core to perform gettering of contaminant atoms, and the contaminant atoms are trapped in crystal defects and the like in the polysilicon layer 11. Therefore, the number of contaminant atoms in the first and second silicon semiconductor substrates 1 and 5 is greatly decreased, so that a high-performance and high-reliability diode can be provided.

In addition, since the polysilicon layer 11 contains P (phosphorus), its gettering capability is further enhanced.

FIG. 6 is a graph showing ratios of lifetimes of the first to third embodiments to that of a conventional semiconductor device when the lifetime of a p-n junction of the conventional semiconductor device is "1". A great improvement of the p-n junction lifetime can be obtained in all the embodiments as in the third embodiment, wherein the polysilicon layer contains P at a concentration of about $5 \times 10^{19}$ atoms/cm$^3$.

Figure 7:
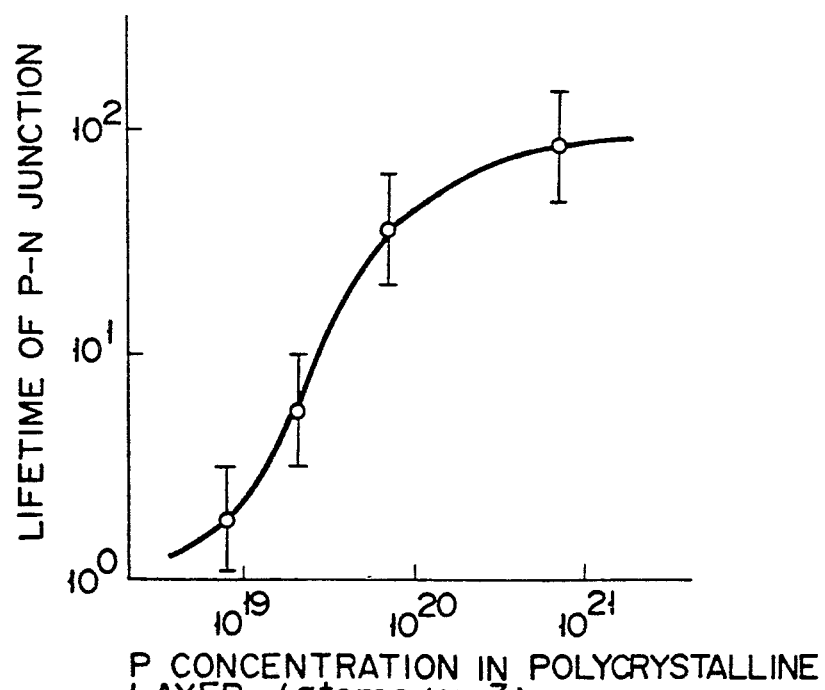
FIG. 7 is a graph showing a ratio of the relationship between the concentration of P (phosphorus) in a polysilicon layer adjacent to a dielectric layer and the life times of p-n junctions of the embodiments of the present invention when the lifetime of a p-n junction of the conventional semiconductor device is "1".

FIG. 7 is a graph showing the ratio of the relationship between the concentration of P (phosphorus) in a polycrystalline layer adjacent to a dielectric layer and the lifetime of a p-n junction when the lifetime of a p-n junction of the conventional semiconductor device is "1". A concentration of P (phosphorus) contained in the polycrystalline layer is basically unlimited. However, as is understood from FIG. 7, the concentration is preferably $1 \times 10^{19}$ atoms/cm$^3$ or more in practice.

As has been described above, in order to perform gettering, the multi-layered semiconductor substrate according to this invention includes a polycrystalline layer formed adjacent to at least one dielectric layer, between a plurality of different semiconductor substrates. This polycrystalline layer serves as a core to perform gettering of contaminant atoms, and the contaminant atoms are trapped in crystal defects and the like in the polycrystalline layer. Therefore, the number of contaminant atoms in the semiconductor substrate is greatly decreased, so that the lifetime of minority carriers in the semiconductor element is prolonged and leak currents in the p-n junction are decreased, thus increasing the production yield. Therefore, the present invention can provide a high-performance and high-reliability semiconductor device.

What is claimed is:

1. A semiconductor device comprising:
   a first semiconductor substrate;
   at least one polycrystalline layer formed on a surface of said first semiconductor substrate;
   a second semiconductor substrate;
   at least one dielectric layer formed on said second semiconductor substrate, said first semiconductor substrate with said polycrystalline layer disposed thereon being annealed to said second semiconductor substrate with the dielectric disposed thereon so that said polycrystalline layer contacts said dielectric layer, the dielectric layer and the polycrystalline layer forming a core for performing gettering of contamination atoms of at least one of the first and second substrates; and
   a first diffusion layer having a high conductivity concentration of predetermined type, and being formed in said first substrate adjacent said polycrystalline layer.

2. A device according to claim 1, wherein said polycrystalline layer comprises a polysilicon layer formed at a growth temperature of about 650° C. by low pressure CVD.

3. A device according to claim 2, wherein said polysilicon layer has a thickness of about 2,000 Å.

4. A device according to claim 1, wherein said polycrystalline layer contains phosphorus at a concentration of $5 \times 10^{19}$ atoms/cm$^3$.

5. A device according to claim 1, wherein said dielectric layer comprises a thermal oxide film formed by thermal oxidation.

6. A device according to claim 1, wherein said dielectric layer comprises a boro-phosphosilicate glass (BPSG) film.

7. A device according to claim 1, wherein said dielectric layer comprises a borosilicate glass (BSG) film.

8. A device according to claim 1, wherein said dielectric layer comprises a phosphosilicate glass (PSG) film.

9. A device according to claim 1, further comprising an insulating region for element isolation.

10. A device according to claim 1, wherein said composite semiconductor substrate comprises at least three substrates.

11. A semiconductor device comprising:
    a first semiconductor substrate;
    a polysilicon layer formed on said first semiconductor substrate;
    a second semiconductor substrate;
    a dielectric layer formed on said second semiconductor substrate, said second semiconductor substrate with the dielectric layer formed thereon being annealed to said first semiconductor substrate with the polysilicon layer formed thereon to form a composite with said dielectric layer contacting said polysilicon layer, the dielectric layer and the polysilicon layer forming a core for performing gettering of contamination atoms of at least one of the first and second substrates;

a first diffusion layer having a high concentration n+-type conductivity, and being formed in said first substrate adjacent said polysilicon layer; and second diffusion layer having a high concentration and p+-type conductivity, and being formed in said first substrate adjacent said first diffusion layer.

12. A device according to claim 11, wherein said polysilicon layer is formed at a growth temperature of about 650° C. by low pressure CVD.

13. A device according to claim 11, wherein said polysilicon layer has a thickness of about 2,000 Å.

14. A device according to claim 11, wherein said polysilicon layer contains phosphorus at a concentration of about $5 \times 10^{19}$ atoms/cm$^3$.

15. A device according to claim 11, wherein said dielectric layer comprises a boro-phosphosilicate glass (BSPG) film.

16. A device according to claim 11, wherein said dielectric layer comprises a borosilicate glass (BSG) film.

17. A device according to claim 11, wherein said dielectric layer comprises a phosphosilicate glass (PSG) film.

18. A device according to claim 11, further comprising a third diffusion layer and an insulating region for element isolation.

* * * * *